US008608885B2

(12) United States Patent
Goto et al.

(10) Patent No.: US 8,608,885 B2
(45) Date of Patent: Dec. 17, 2013

(54) SUBSTRATE HEAT TREATMENT APPARATUS

(75) Inventors: Shigehiro Goto, Kyoto (JP); Keiji Matsuchika, Kyoto (JP); Akihiko Morita, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 1078 days.

(21) Appl. No.: 11/566,442

(22) Filed: Dec. 4, 2006

(65) Prior Publication Data

US 2007/0128570 A1   Jun. 7, 2007

(30) Foreign Application Priority Data

Dec. 7, 2005   (JP) ................... 2005-353432

(51) Int. Cl.
*B29C 65/02* (2006.01)

(52) U.S. Cl.
USPC ........ 156/85; 432/5; 432/6; 432/81; 432/249; 432/253; 432/258; 432/259; 219/443.1; 219/444.1; 219/448.11; 219/451.1; 219/465.1; 219/466.1; 219/468.1; 219/468.2; 219/544; 219/546; 219/547; 219/548

(58) Field of Classification Search
USPC ................... 432/5, 6, 253, 258, 259, 81, 249; 219/443.1, 444.1, 448.11, 451.1, 219/465.1, 466.1, 468.1, 468.2, 544, 546, 219/547, 548; 156/85
See application file for complete search history.

(56) References Cited

U.S. PATENT DOCUMENTS

| 3,904,352 | A  | * | 9/1975  | Thurnauer et al. ................. 432/5 |
| 4,218,413 | A  | * | 8/1980  | Stowell et al. ................... 264/13 |
| 6,264,467 | B1 | * | 7/2001  | Lue et al. ...................... 432/253 |
| 6,394,797 | B1 |   | 5/2002  | Sugaya et al. |
| 6,634,882 | B2 | * | 10/2003 | Goodman ..................... 432/253 |
| 7,432,476 | B2 | * | 10/2008 | Morita et al. .............. 219/444.1 |
| 7,718,925 | B2 | * | 5/2010  | Goto et al. .................... 219/390 |
| 2003/0186183 | A1 | * | 10/2003 | Ito et al. ....................... 432/253 |
| 2007/0128888 | A1 | * | 6/2007  | Goto et al. .................... 438/795 |
| 2007/0128889 | A1 | * | 6/2007  | Goto et al. .................... 438/795 |

FOREIGN PATENT DOCUMENTS

| JP | 2-290013    | 11/1990 |
| JP | 8-279548    | 10/1996 |
| JP | 10-284360   | 10/1998 |
| JP | 2003-22947  | 1/2003  |
| JP | 2004-288717 | 10/2004 |

* cited by examiner

*Primary Examiner* — Yogendra Gupta
*Assistant Examiner* — Joshel Rivera
(74) *Attorney, Agent, or Firm* — Ostrolenk Faber LLP

(57) ABSTRACT

A substrate heat treatment apparatus includes a heat-treating plate having a flat upper surface, support devices formed of a heat-resistant resin for contacting and supporting a substrate, a seal device disposed annularly for rendering gastight a space formed between the substrate and heat-treating plate, and exhaust bores for exhausting gas from the space. The support devices are formed of resin, and the upper surface of the heat-treating plate is made flat, whereby a reduced difference in the rate of heat transfer occurs between contact parts and non-contact parts on the surface of the substrate. Consequently, the substrate is heat-treated effectively while suppressing variations in heat history over the surface of the substrate.

26 Claims, 9 Drawing Sheets

SUBSTRATE HEAT TREATMENT APPARATUS

BACKGROUND OF THE INVENTION (1) Field of the Invention

This invention relates to a substrate heat treatment apparatus for heat-treating substrates such as semiconductor wafers, glass substrates for liquid crystal displays, glass substrates for photomasks and substrates for optical disks (hereinafter simply called "substrates"). More particularly, the invention relates to a technique for heat-treating a substrate as sucked in a position slightly spaced from a heat-treating plate.

(2) Description of the Related Art

With an increasingly fine line width of patterns formed on substrates today, the requirements for line width uniformity have become stringent, which has led to a strong demand for temperature uniformity in baking treatment in photolithography, especially in baking treatment after exposure (PEB: Post Exposure Bake). However, with enlarged substrate sizes, increased curvatures of substrates take place in the semiconductor manufacturing process. It is difficult to satisfy the requirements for temperature uniformity in a proximity heating mode that heats each substrate only by placing the substrate as separated by a minute space from a heat-treating plate.

Thus, a suction bake mode has been proposed in order to perform uniform heat treatment even for curved substrates. This type of apparatus includes a heat-treating plate with a heater, support elements and a sealer arranged on the upper surface of the heat-treating plate, and exhaust bores formed in the upper surface of the heat-treating plate.

The support elements are in the form of bulges and dimples formed by machining the upper surface of the heat-treating plate (as disclosed in Japanese Unexamined Patent Publication H2-290013 (1990), for example), or metallic projections formed on the upper surface of the heat-treating plate and coated with resin (as disclosed in Japanese Unexamined Patent Publication H10-284360 (1998), for example). The sealer is in the form of a ring disposed in a position for contacting edges of a substrate. With these apparatus, the substrate is sucked as the sealer closes lateral areas of a space formed between the heat-treating plate and the substrate supported by the support elements, and gas is exhausted from this space through the exhaust bores. By sucking the substrate in this way, any curvature of the substrate is corrected whereby the substrate is heated uniformly.

The conventional apparatus noted above have the following drawbacks.

In the former construction, the bulges and dimples are formed of the same material as the heat-treating plate, and have a much higher thermal conductivity than air. Therefore, the thermal resistance between the bulges and the substrate in direct contact is much smaller than the thermal resistance between the dimples and the substrate not in direct contact but interposed by space. In time of heat treatment, therefore, heat is transferred faster to the parts (contact parts) of the substrate in contact with the bulges than to the parts (non-contact parts) of the substrate out of contact with the bulges. The rate of temperature increase differs greatly between the contact parts and non-contact parts, causing serious variations in heat history over the substrate surface. As a result, a pattern of uniform line width cannot be formed on the substrate.

In the latter construction, surfaces of the projections are coated with resin in order to prevent metallic contamination. Since the interiors of the projections are metal with high thermal conductivity, heat is positively transferred to the parts (contact parts) of the substrate in contact with the projections. On the other hand, heat transfer to the parts (non-contact parts) of the substrate out of contact with the projections takes place through a gas layer, and is relatively small in amount. This results in the inconvenience of the rate of temperature increase differing greatly between the contact parts and non-contact parts, causing serious variations in heat history over the substrate surface.

SUMMARY OF THE INVENTION

This invention has been made having regard to the state of the art noted above, and its object is to provide a substrate heat treatment apparatus for heat-treating a substrate effectively while suppressing variations in heat history over a substrate surface between contact parts in contact with support devices and non-contact parts out of contact with the support devices.

The above object is fulfilled, according to this invention, by a substrate heat treatment apparatus for heat-treating a substrate, comprising a heat-treating plate having a flat upper surface; support devices arranged on the upper surface of the heat-treating plate and formed of a heat-resistant resin for contacting and supporting the substrate; a seal device disposed annularly on the upper surface of the heat-treating plate for contacting edges of the substrate to render gastight a space formed between the substrate and the heat-treating plate; and exhaust bores for exhausting gas from the space.

According to this invention, the seal device renders gastight the space formed between the substrate and the heat-treating plate. The exhaust bores are provided for exhausting gas from this space, thereby holding the substrate by suction. In this way, the separation of the substrate and heat-treating plate can be maintained uniform. Further, the support devices are formed of resin, and the upper surface of the heat-treating plate is made flat. This reduces the difference in the rate of heat transfer between contact parts on the surface of the substrate in contact with the heat-treating plate, and non-contact parts out of contact with the heat-treating plate. Consequently, the substrate can be heat-treated effectively while suppressing variations in heat history over the surface of the substrate.

In the above apparatus, the support devices may be porous. The porous support devices can further reduce the difference in the rate of heat transfer between the contact parts and non-contact parts.

The support devices may be arranged separately from one another for point contact with the substrate. Since the area of contact between the support devices and substrate is reduced, the variations in heat history over the substrate surface can be further suppressed.

The support devices may be arranged regularly. This arrangement can suppress flexion of the substrate.

Each of the support devices may have a sectional shape becoming smaller from a lower portion to an upper portion that contacts the substrate. This is effective to prevent the support devices from buckling when the substrate is sucked.

The support devices may be arranged in concentric circles for line contact with the substrate. The support devices can maintain the separation of the substrate and heat-treating plate uniform, thereby suppressing variations in heat history over the substrate surface.

Each of the support devices may have groove portions for allowing communication between regions inside and outside thereof. Then, the space formed between the substrate and heat-treating plate is not divided by the support devices. Consequently, the substrate can be sucked effectively by exhausting gas through the exhaust bores.

In the above apparatus, each of the support devices may have a sectional shape becoming smaller from a lower portion to an upper portion that contacts the substrate. This is effective to prevent the support devices from buckling when the substrate is sucked.

The support devices may be a sheet-like object having projections formed thereon for contacting the substrate. Such support devices are simple in construction.

The projections may be arranged to make point contact with the substrate. Since the area of contact between the support devices and substrate is reduced, the variations in heat history over the substrate surface can be further suppressed.

The projections may be arranged regularly. This arrangement can suppress flexion of the substrate.

The projections may be arranged in concentric circles. The support devices can maintain the separation of the substrate and heat-treating plate uniform, thereby suppressing variations in heat history over the substrate surface.

Each of the projections may have groove portions for allowing communication between regions inside and outside thereof. Then, the space formed between the substrate and heat-treating plate is not divided by the support devices (projections). Consequently, the substrate can be sucked effectively by exhausting gas through the exhaust bores.

Each of the projections may have a sectional shape becoming smaller from a lower portion to an upper portion that contacts the substrate. This is effective to prevent the support devices from buckling when the substrate is sucked.

The sheet-like object may include a ring-shaped ridge for contacting the edges of the substrate to render gastight the space formed between the substrate and the heat-treating plate, thereby acting as the seal device. Such support devices and seal device are simple in construction.

The support devices may include granular objects, and a coating layer covering the granular objects. Such support devices are simple in construction.

The apparatus may further comprise a resin layer disposed between the support devices and the heat-treating plate. The resin layer allows the support devices to be arranged appropriately.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of this invention will be described in detail hereinafter with reference to the drawings.

Embodiment 1

Embodiment 1 of this invention will be described hereinafter with reference to the drawings.

Figure 1:
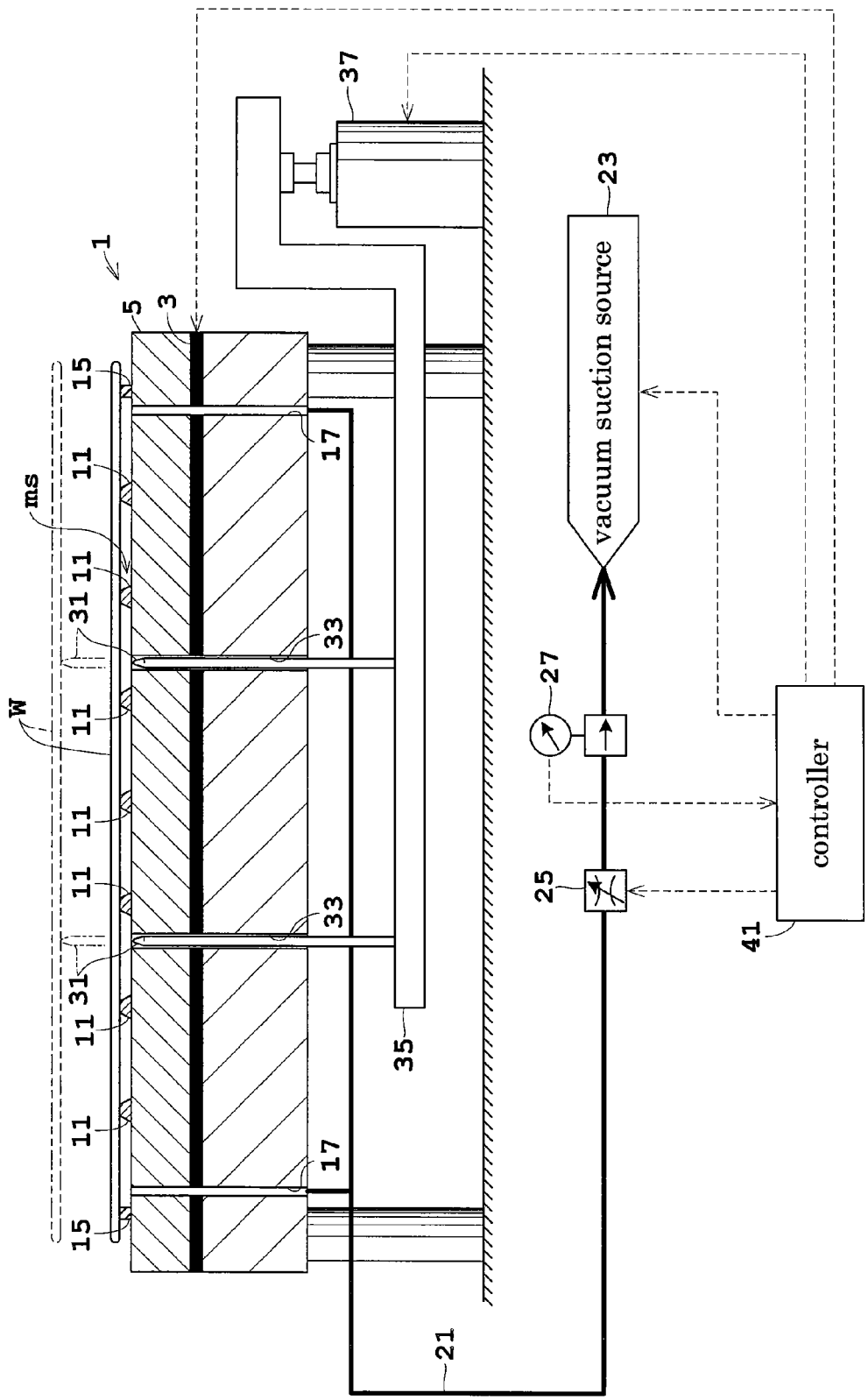
FIG. 1 is a view in vertical section showing an outline of a substrate heat treatment apparatus in Embodiment 1.

FIG. 1 is a view in vertical section showing an outline of a substrate heat treatment apparatus in Embodiment 1.

Figure 2:
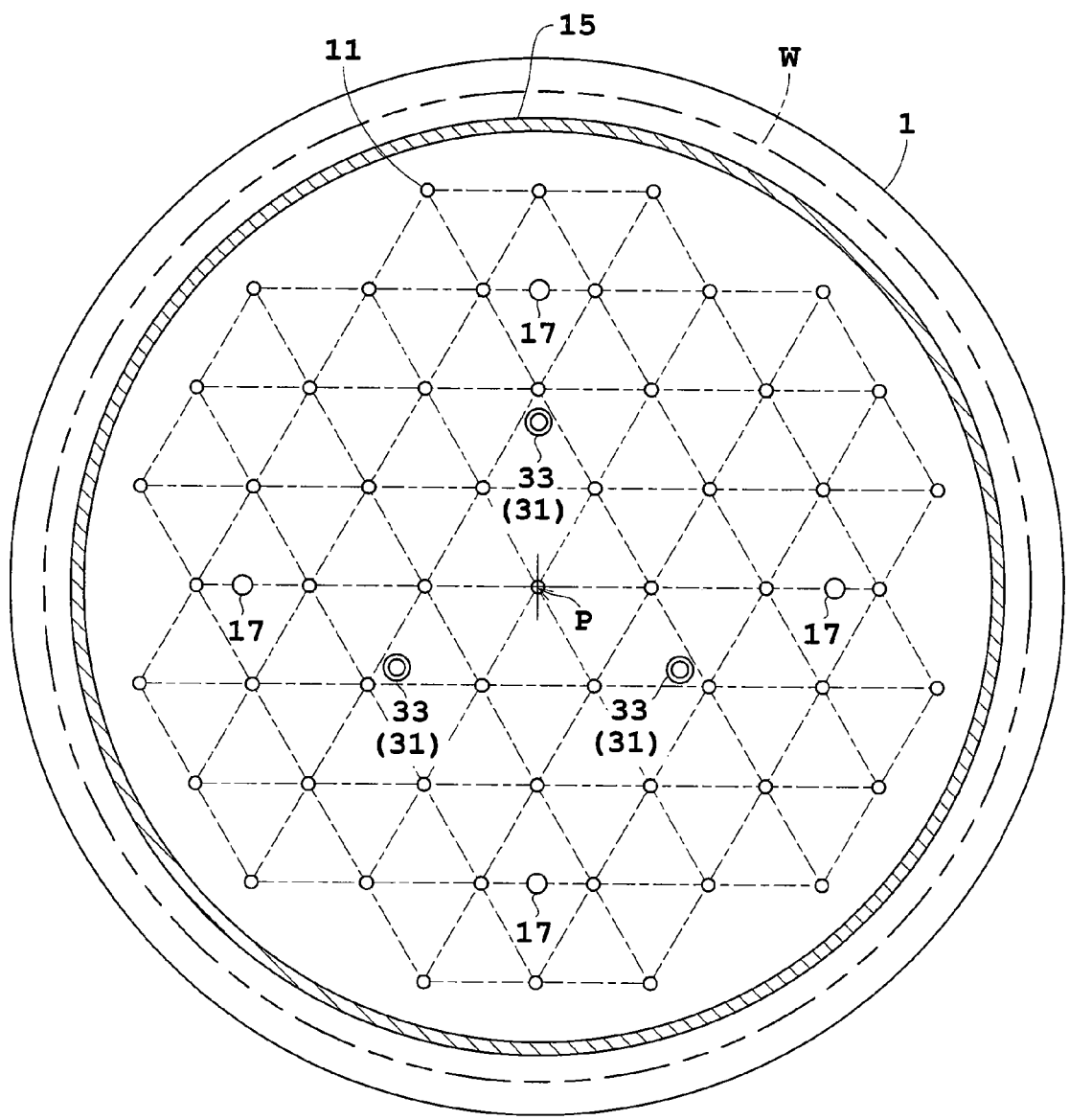
FIG. 2 is a plan view of a heat-treating plate in Embodiment 1.

FIG. 2 is a plan view of a heat-treating plate.

A heat-treating plate 1 for supporting a substrate or wafer W under treatment is circular and has a slightly larger diameter than the wafer W in plan view. The upper surface of the plate 1 is flat. The heat-treating plate 1 is formed of a metal such as copper or aluminum having high thermal conductivity, for example. The heat-treating plate 1 has a heating element 3 such as a mica heater mounted therein. A heat transfer portion 5 between the heating element 3 and the upper surface of heat-treating plate 1 has a plurality of heat pipes, not shown, embedded therein. Cooling grooves, not shown, are formed between the heat pipes for circulating a cooling fluid.

The heat-treating plate 1 has a plurality of (55 in FIG. 2) support elements 11 arranged on the upper surface thereof for contacting and supporting the lower surface of the wafer W. The support elements 11 are formed of heat-resistant resin. Preferably, the resin is resistant to chemicals also. Further, it is preferred that the resin is a porous material. Specifically, such material may, for example, be polyimide, polytetrafluoroethylene (PTFE), polychlorotrifluoroethylene (PCTFE), polyetheretherketone (PEEK), polyphenylene sulphide (PPS), polyvinylidene fluoride (PVDF), polyethersulfone (PES), polysulfone (PSF), polyetherimide (PEI), or heat-resistant rubber materials. Regarding the thermal conductivity of support elements 11, polyimide is 0.12 W/m·K and PTFE is 0.25 W/m·K, far lower than copper (372 W/m·K) and aluminum (183 W/m·K), and close to air (0.026 W/m·K).

Each support element 11 has a sectional shape tapering from a lower portion to an upper portion that contacts the wafer W. Specifically, each support element 11 is pillar-shaped with a diameter enlarging from the upper portion that contacts the wafer W to the lower portion. The height of support elements 11, preferably, is 40 to 120 µm, and its preferred diameter is 0.1 to 2mm.

The support elements 11 are arranged separately from one another. In this embodiment, the support elements 11 are arranged regularly. Specifically, equilateral triangles are assumed to be arranged regularly and continually on the upper surface of heat-treating plate 1 (in FIG. 2, the equilateral triangles are shown in alternate long and short dash lines). The support elements 11 are attached to apexes of these equilateral triangles by adhesive or by thermal fusion. One of the support elements 11 is located at a center point P of the heat-treating plate 1. Each support element 11 supports the wafer W through point contact. The support elements 11 correspond to the support devices in this invention.

The heat-treating plate 1 has a ring-shaped sealer 15 mounted on the upper surface thereof and having an inside diameter slightly smaller than the outside diameter of the wafer W in plan view. The sealer 15 contacts edge regions of the wafer W to render gastight a minute space (also called proximity gap) "ms" formed between the heat-treating plate 1 and the wafer W supported by the support elements 11. The sealer 15, preferably, is formed of polyimide resin which has heat resistance and elasticity, for example. Another usable material is fluororesin. The sealer 15 need not be formed of the same the material as the support elements 11. It is preferred that the sealer 15 usually has a projecting height exceeding the height of support elements 11 by a squeeze margin corresponding to an amount of compression occurring when the wafer W is drawn by suction. Thus, the sealer 15, when in contact with the peripheral regions of the wafer W, is compressed to the same height as the support elements 11, to enhance gastightness of the minute space "ms". The sealer 15 corresponds to the seal device in this invention.

Further, the heat-treating plate 1 has exhaust bores 17 formed in the upper surface thereof for exhausting gas from the minute space "ms". The plurality of (e.g. four) exhaust bores 17 are arranged equidistantly in the circumferential direction. Each exhaust bore 17 extends down to the lower surface of heat-treating plate 1. One end of exhaust piping 21 is connected commonly to these exhaust bores 17, and a vacuum suction source 23 is connected to the other end of the exhaust piping 21. This vacuum suction source 23 is a vacuum utility provided for a cleanroom, for example. The exhaust piping 21 has a pressure regulating valve 25 for regulating pressure (negative pressure) in the minute space "ms", and a pressure gauge 27 for measuring the pressure. The exhaust piping 21 may also have a switch valve with a vacuum breaker. The exhaust piping 21 and vacuum suction source 23 function as an exhaust device.

The heat-treating plate 1 further includes transfer members 31 for transferring the wafer W to and from a transport device not shown. The transfer members 31 are rod-shaped, and are formed of ceramics, for example. In this embodiment, the heat-treating plate 1 has three perforations 33 formed to extend vertically therethrough, in positions corresponding to the apexes of an equilateral triangle centering on the center point P of heat-treating plate 1 and clear of the support elements 11 in plan view. The transfer members 31 are inserted in the perforations 33, respectively. The transfer members 31 have lower ends thereof commonly connected to a single support base 35. The support base 35 is connected to a working rod of an air cylinder 37. The air cylinder 35 is operable to raise and lower the support base 35. These transfer members 31, support base 35 and air cylinder 37 function as a substrate transfer device.

A controller 41 performs an overall control of the apparatus, i.e. controls output of the heating element 3 noted hereinbefore, switching operation of the pressure regulating valve 25, driving of the vacuum suction source 23, and driving of the air cylinder 37. These controls are performed based on a recipe stored beforehand. The switching operation of the pressure regulating valve 25 is based on results of detection by the pressure gauge 27. The controller 41 is realized by a central processing unit (CPU) which performs various processes, a RAM (Random Access Memory) used as the workspace for operation processes, and a storage medium such as a fixed disk for storing a variety of information.

Figure 3:
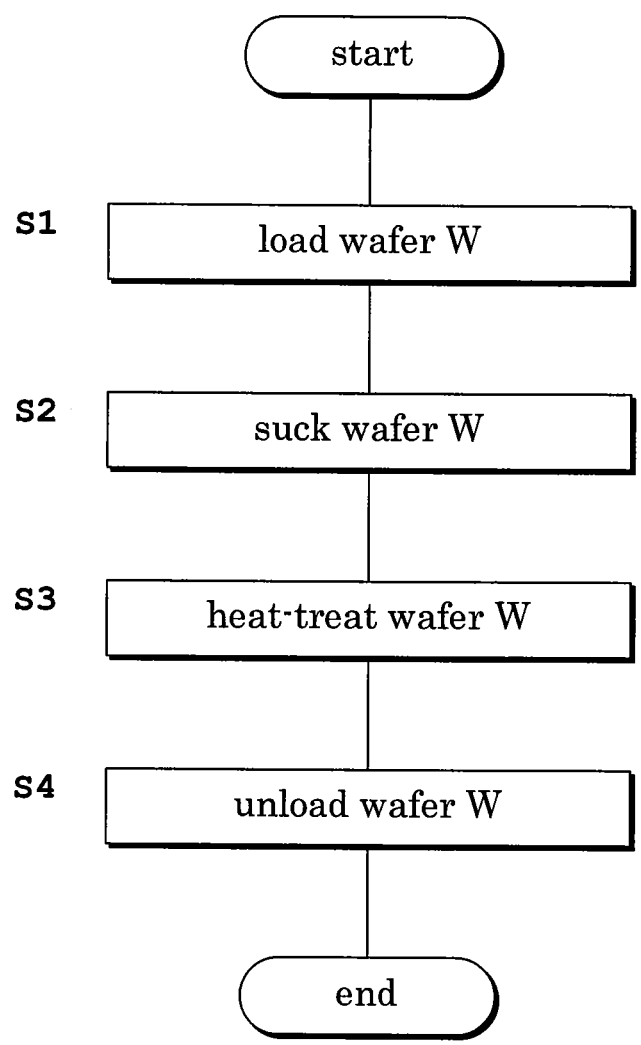
FIG. 3 is a flow chart showing a procedure of treatment by the substrate heat treatment apparatus.

Operation of the substrate heat treatment apparatus having the above construction will be described with reference to FIG. 3. FIG. 3 is a flow chart illustrating a procedure of treatment by the substrate heat treatment apparatus. Temperature control of the heating element 3, for example, is assumed to have already been carried out according to the recipe, and will be omitted from the following description.

<Step S1> Load Wafer W

As the transport device, not shown, loads a wafer W in horizontal posture into the apparatus, the controller 41 drives the air cylinder 37 to raise the support base 35. The transfer members 31 project above the upper surface of heat-treating plate 1, and receive the wafer W. Subsequently, the air cylinder 37 is reversed to lower the transfer members 31. The wafer W is supported through point contact by the support elements 11, and the minute space "ms" is formed between the wafer W and heat-treating plate 1. The edge regions of wafer W contact the sealer 15 to render the minute space "ms" gastight.

<Step S2> Suck Wafer W

The controller 41 drives the vacuum suction source 23, and operates the pressure regulating valve 25. As a result, the gas (i.e. air or nitrogen) in the minute space "ms" is exhausted through the exhaust bores 17 and exhaust piping 21. The pressure in the minute space "ms" is adjusted to a negative pressure. As a result, the wafer W is sucked toward the heat-treating plate 1. A curvature of wafer W, if any, is corrected to follow the support elements 11 and sealer 15.

Figure 4A:
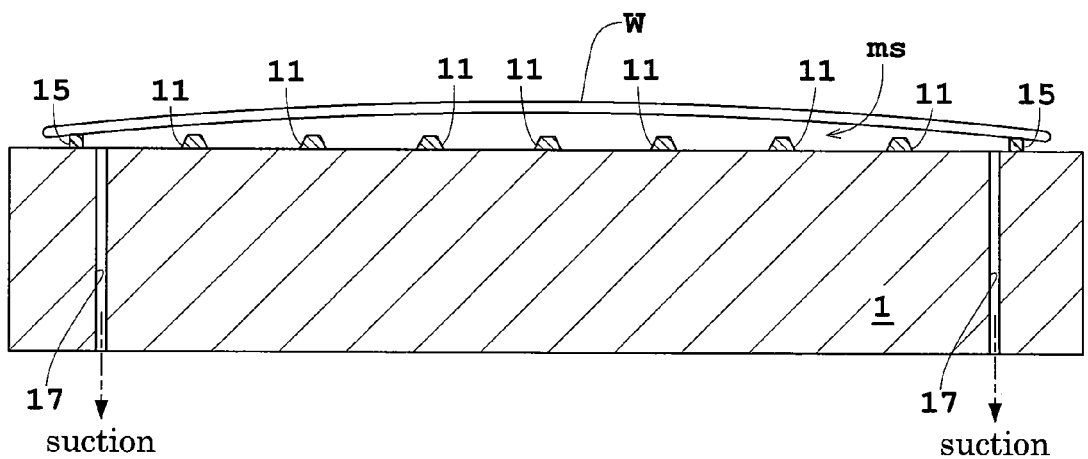
FIG. 4A is an explanatory view showing treatment of a curved substrate with a central portion thereof bulging away from the heat-treating plate.
Figure 4B:
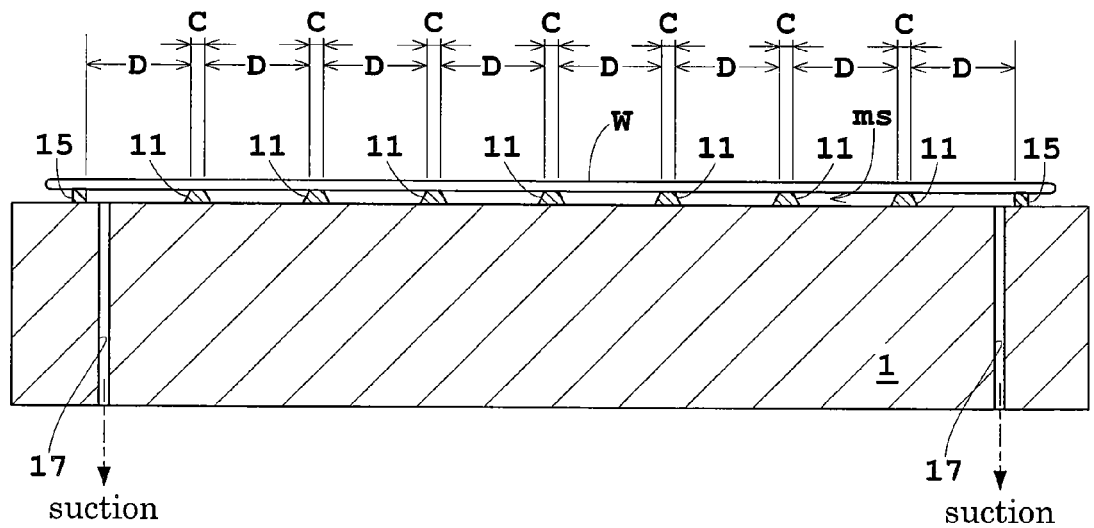
FIG. 4B is an explanatory view showing treatment of the curved substrate with the central portion bulging away from the heat-treating plate.
Figure 5A:
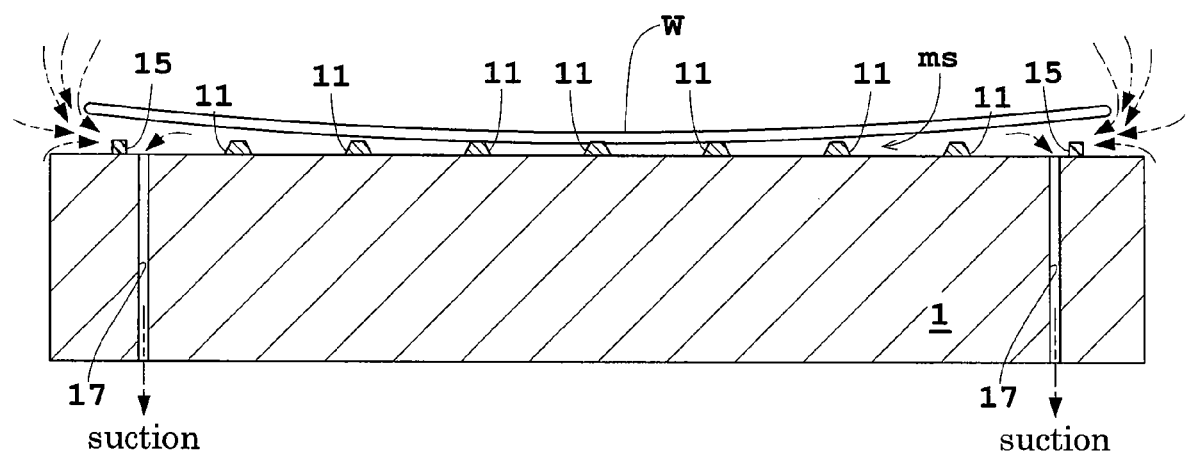
FIG. 5A is an explanatory view showing treatment of a curved substrate with a central portion thereof bulging toward the heat-treating plate.

This process will particularly be described with reference to FIGS. 4A, 4B, 5A and 5B. The curvature of wafer W includes a case where, as shown in FIG. 4A, the wafer W is curved to have the central part bulging upward (dome-like curvature), and a case where, as shown in FIG. 5A, the wafer W is curved to have the central part bulging downward (bowl-like curvature).

Figure 5B:
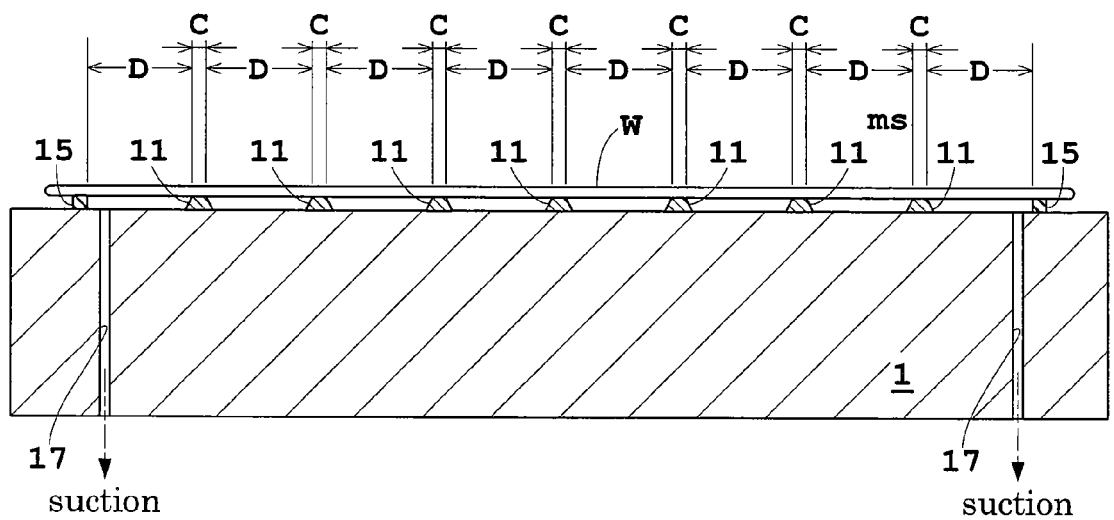
FIG. 5B is an explanatory view showing the treatment of the curved substrate with the central portion bulging toward the heat-treating plate.

When the wafer W with the central part bulging upward is in place, the sealer 15 is in contact with the wafer W to render the minute space "ms" gastight. Thus, the wafer W is drawn toward the heat-treating plate 1 by suction until the central part of wafer W contacts the support elements 11. As a result, the curvature of wafer W is corrected to be substantially level as shown in FIG. 4B. On the other hand, when the wafer W with the central part bulging downward is in place, the wafer W is still out of contact with the sealer 15 so that the minute space "ms" is open sideways. However, the suction applied in this state will cause gas to flow from the ambient through the gap between the wafer W and sealer 15 into the minute space "ms", producing Bernoulli effect to draw the edge regions of wafer W downward (FIG. 5A shows air flows in two-dot chain lines). The sealer 15 will soon contact the edge regions of the wafer W to render the minute space "ms". The curvature of wafer W is corrected to be substantially level as shown in FIG. 5B.

<Step S3> Heat-treat Wafer W

A predetermined heat treatment is carried out for the wafer W while maintaining the wafer W in the suction-supported state for a predetermined time. At this time, heat is transferred from the support elements 11 to contact parts C of the surface of wafer W in contact with the support elements 11. To non-contact parts D of the surface of wafer W out of contact with the support elements 11, heat is transferred by heat conduction from the gas in the minute space "ms" heated by the heat-treating plate 1.

<Step S4> Unload Wafer W

Upon completion of the heat treatment performed for the predetermined time, the controller 41 stops the vacuum suction source 23 and closes the pressure regulating valve 25, to stop the gas exhaustion from the minute space "ms" and return the pressure in the minute space "ms" to atmospheric pressure. As a result, the wafer W is released from suction.

Subsequently, the air cylinder 37 is driven to raise the transfer members 31 and wafer W. In this state, the transport device, not shown, unloads the wafer W from the apparatus.

According to this substrate heat treatment apparatus, as described above, the wafer W is sucked and held in place by exhausting gas from the minute space "ms". Thus, the separation of the wafer W and heat-treating plate 1 can be made uniform. The support elements 11 are formed of resin, whereby the thermal conductivity of support elements 11 per se is brought close to the thermal conductivity of air. Compared with the case of using support elements formed of metal, a reduced difference in the rate of heat transfer occurs between contact parts C and non-contact parts D on the surface of wafer. Further, the upper surface of heat-treating plate 1 is made flat. Compared with the case of using a heat-treating plate with bulges and dimples, a reduced difference in the rate of heat transfer occurs between contact parts C and non-contact parts D on the surface of wafer W. Consequently, the wafer W can be heat-treated effectively while suppressing variations in heat history over the surface of wafer W. As a result, a pattern of uniform line width can be formed on the wafer W.

The support elements 11 support the wafer W through point contact, to reduce the area of contact with the wafer W, thereby further suppressing variations in heat history over the surface of wafer W. Generation of particles can also be prevented. The support elements 11 have a sectional shape enlarging from the upper portion to the lower portion. This is effective to prevent the support elements 11 from buckling when the wafer W is sucked. Edges at the upper potion of each support element 11 are hardly subjected to damage such as chipping. With the support elements 11 formed of a porous resin, the rate of heat transfer to the contact parts C can be brought closer to the rate of heat transfer to the non-contact parts D on the surface of wafer W.

Embodiment 2

Figure 6A:
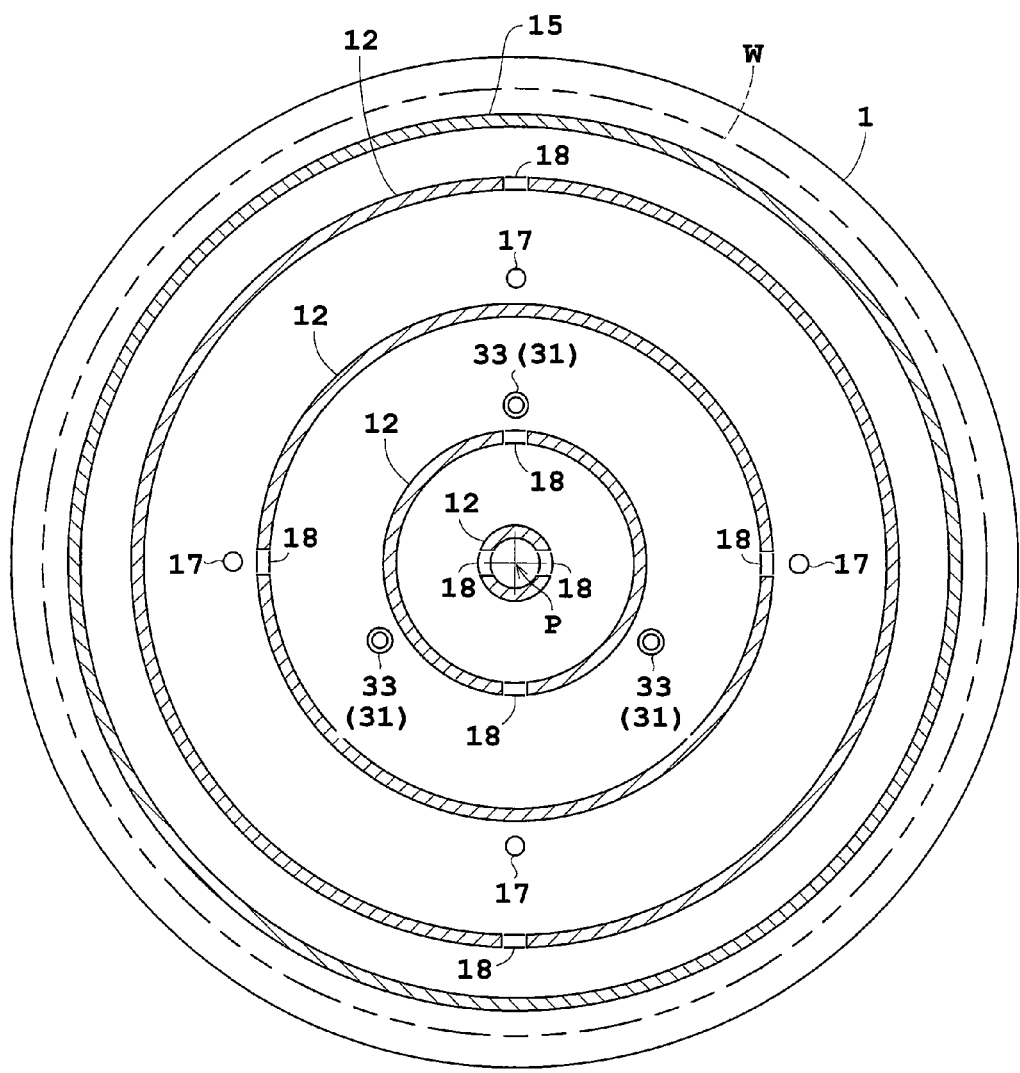
FIG. 6A is a plan view of a heat-treating plate in Embodiment 2.
Figure 6B:
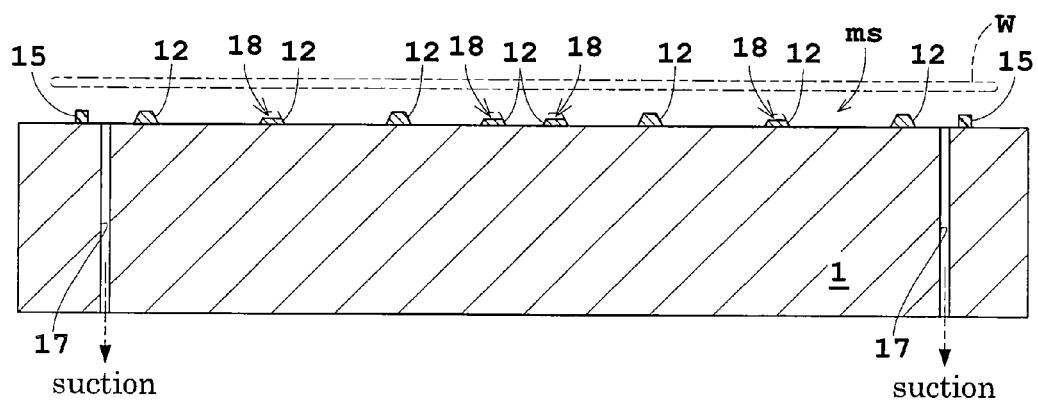
FIG. 6B is a view in vertical section of the heat-treating plate in Embodiment 2.

Embodiment 2 of this invention will be described hereinafter with reference to the drawings. Like reference numerals are used to identify like parts which are the same as in Embodiment 1 and will not particularly be described. FIG. 6A is a plan view of a heat-treating plate. FIG. 6B is a view in vertical section of the heat-treating plate.

Embodiment 2 is different from Embodiment 1 in support elements 12. The heat-treating plate 1 has a plurality of (e.g. four) support elements 12 arranged in concentric circles. More particularly, the support elements 12 are ring-shaped, different in diameter, and arranged concentrically about the center point P on the upper surface of heat-treating plate 1. Each support element 12 has a sectional shape tapering from a lower portion to an upper portion that contacts a wafer W. Grooves 18 are formed in varied positions of each support element 12 for allowing communication between regions inside and outside each support element 12. The support elements 12 are formed of the same material as the support elements 11 described in Embodiment 1, for example. Each support element 12 supports the wafer W through line contact. At this time, the grooves 18 serve as vents between the regions inside and outside each support element 12. The support elements 12 correspond to the support devices in this invention. The grooves 18 correspond to the groove portions in this invention.

Operation of the substrate heat treatment apparatus in Embodiment 2 in time of sucking the wafer W will be described.

The minute space "ms" formed between the wafer W and heat-treating plate 1 is a single space communicating through the grooves 18, without being divided by each support element 12. The controller 41 operates the vacuum suction source 23 and pressure regulating valve 25 to adjust the pressure in the minute space "ms" to a negative pressure. The wafer W is drawn toward the heat-treating plate 1, and is leveled to follow the support elements 12 and sealer 15.

According to the substrate heat treatment apparatus in Embodiment 2 also, the separation of the wafer W and heat-treating plate 1 can be maintained uniform. The support elements 12 are formed of resin, and the upper surface of heat-treating plate 1 is made flat. As a result, the wafer W can be heat-treated effectively while suppressing variations in heat history over the surface of wafer W.

Embodiment 3

Figure 7:
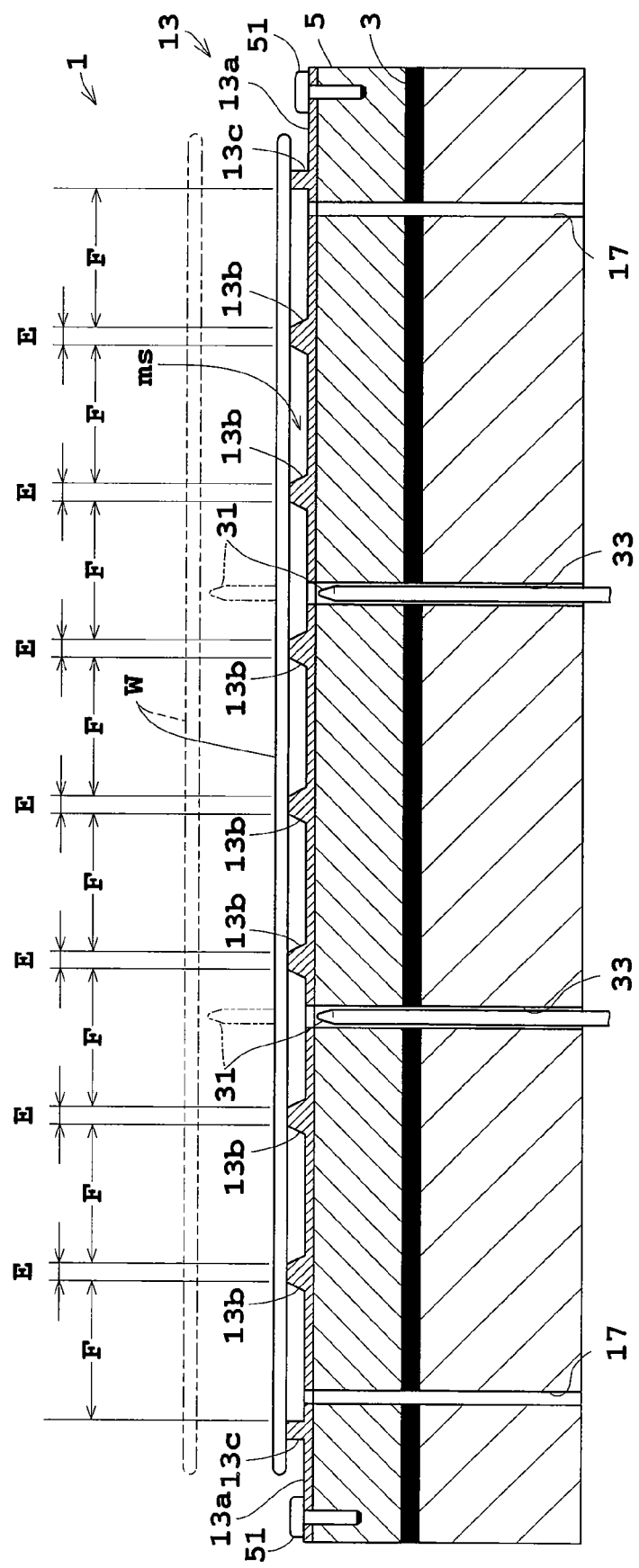
FIG. 7 is a sectional view of a heat-treating plate in Embodiment 3.

Embodiment 3 of this invention will be described hereinafter with reference to FIG. 7. Like reference numerals are used to identify like parts which are the same as in Embodiment 1 and will not particularly be described. FIG. 7 is a sectional view of a heat-treating plate.

Embodiment 3 is different from Embodiment 1 in having a support and seal member 13 instead of the support elements 11 and sealer 15. The support and seal member 13 is a sheet-like object having projections 13b formed thereon for contacting a wafer W. More particularly, the support and seal member 13 includes a sheet-like base 13a covering the entire surface of heat-treating plate 1 and having, formed thereon, a plurality of projections 13b, and a ring-shaped ridge 13c having an inside diameter slightly smaller than the outside diameter of the wafer W. The support and seal member 13 has openings formed in positions opposed to the exhaust bores 17 and perforations 33.

Each projection 13b is pillar-shaped, and makes a point contact with the wafer W. Each projection 13b has a sectional shape tapering from a lower portion to an upper portion that contacts the wafer W. The diameter of each projection 13b, preferably, is 0.1 to 2 mm. The height of projections 13b including the thickness of the base 13a, preferably, is 70 to 250 μm, and that excluding the thickness of the base 13a (i.e. projecting height from the upper surface of base 13a), preferably, is 40 to 120 μm. The projections 13b are arranged regularly on the base 13a. In this embodiment, as are the support elements 11 in Embodiment 1, the projections 13b are arranged in positions corresponding to the apexes of equilateral triangles assumed to be arranged regularly and continually.

The height of ridge 13c is equal to the height of projections 13b. The width of ridge 13c, preferably, is 0.01 to 2 mm. The ridge 13c contacts the edge regions of the wafer W to render the space formed by the wafer W gastight.

The support and seal member 13 is formed of the same material as the support elements 11 described in Embodiment 1, for example. This support and seal member 13 is obtained by etching a resin sheet (resin layer or resin film). However, the method of manufacturing the support and seal member 13 is not limited to the above. The projections 13b and ridge 13c may be formed on the base 13a by heat welding. The support and seal member 13 may be formed as an integral object, by punching or laser processing a resin sheet.

The support and seal member 13 is mechanically fixed by bolts 51 or the like to edge regions of the heat-treating plate 1. Instead, the support and seal member 13 may be bonded to the upper surface of heat-treating plate 1 with a heat-resistant adhesive, for example. The support and seal member 13 corresponds to the support devices in this invention, and also to the seal device in this invention.

Operation of the substrate heat treatment apparatus in Embodiment 3 in time of heat-treating the wafer W will be described.

When heat-treating the wafer W, heat is transferred from the support and seal member 13 to contact parts E of the surface of wafer W in contact with the support and seal member 13. To non-contact parts F out of contact with the support and seal member 13, heat is transferred by heat conduction from the gas in the minute space "ms". To the gas in the minute space "ms", heat is transferred from the heat-treating plate 1 through the base 13a.

According to the substrate heat treatment apparatus in Embodiment 3 also, the separation of the wafer W and heat-treating plate 1 can be maintained uniform. The support and seal member 13 is formed of resin, and the upper surface of heat-treating plate 1 is made flat. As a result, the wafer W can be heat-treated effectively while suppressing variations in heat history over the surface of wafer W.

Since heat is transferred to the gas in the minute space "ms" through the base 13a, slight variations in the temperature distribution over the heat-treating plate 1 (e.g. ±0.2 degrees) are absorbed to heat the gas in the minute space "ms" uniformly. Consequently, the heat conduction from the gas in the minute space "ms" to the wafer W is made uniform.

The support and seal member 13 having the projections 13b and ridge 13c contributes toward a simple construction. The ridge 13c formed integral with the base 13a and projections 13b is positively prevented from separating or falling from the heat-treating plate 1, compared with the sealer 15 and support elements 11 attached separately as described in Embodiment 1.

Embodiment 4

Figure 8:
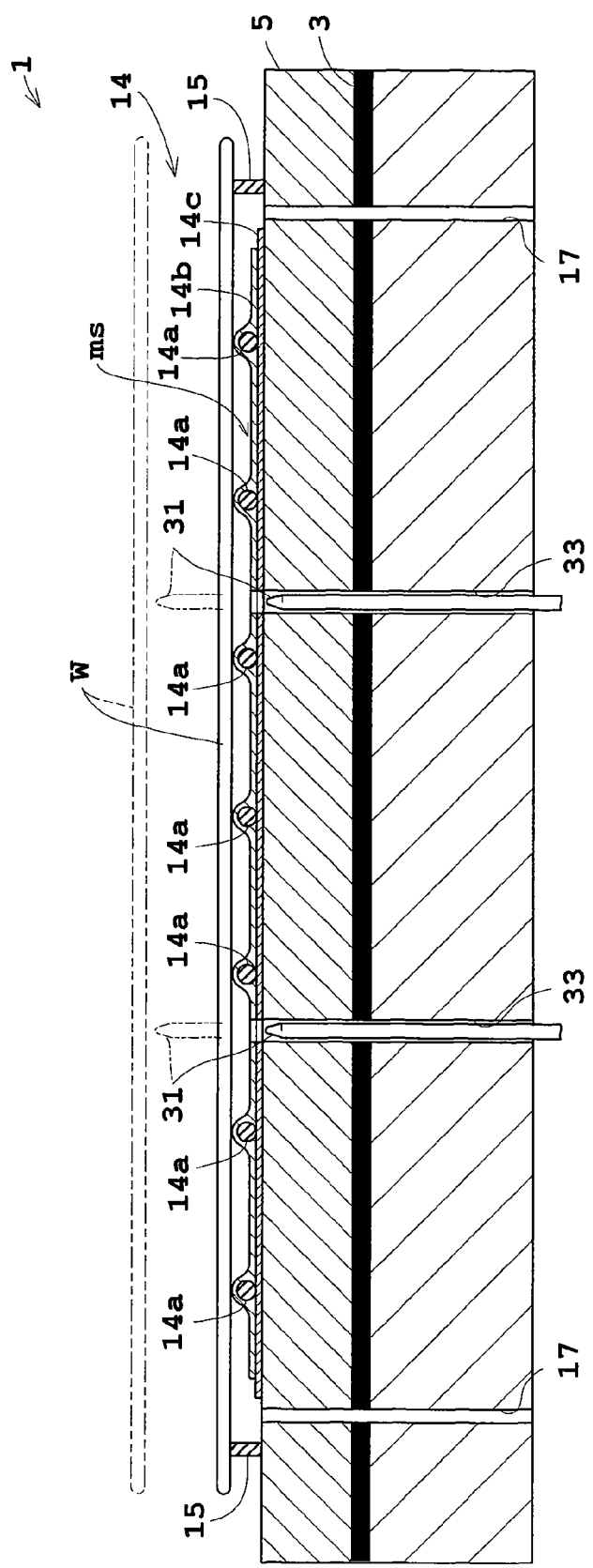
FIG. 8 is a sectional view of a heat-treating plate in Embodiment 4.

Embodiment 4 of this invention will be described hereinafter with reference to FIG. 8. Like reference numerals are used to identify like parts which are the same as in Embodiment 1 and will not particularly be described. FIG. 8 is a sectional view of a heat-treating plate. Embodiment 4 is different from Embodiment 1 in having support elements 14 instead of the support elements 11. The support elements 14 include granular objects 14a and a coating layer 14b covering the granular objects 14a. Further, the support elements 14 include, as a lower layer, a resin layer 14c coating the upper surface of heat-treating plate 1.

The resin layer 14c is applied and formed inwardly of the sealer 15 on the heat-treating plate 1. The granular objects 14a are arranged on this resin layer 14c, and the coating layer 14b is formed to cover the granular objects 14a. The positions of support elements 14 where the granular objects 14a are arranged bulge higher than the portions with no granular objects. These bulging positions contact and support the wafer W. The support elements 14 are formed of the same material as the support elements 11 in Embodiment 1. However, the granular objects 14a, coating layer 14b and resin layer 14c need not be the same material. The support elements 14 correspond to the support devices in this invention.

According to the substrate heat treatment apparatus in Embodiment 4 also, the separation of the wafer W and heat-treating plate 1 can be maintained uniform. The support elements 14 are formed of resin, and the upper surface of heat-treating plate 1 is made flat. As a result, the wafer W can be heat-treated effectively while suppressing variations in heat history over the surface of wafer W.

Embodiment 5

Figure 9A:
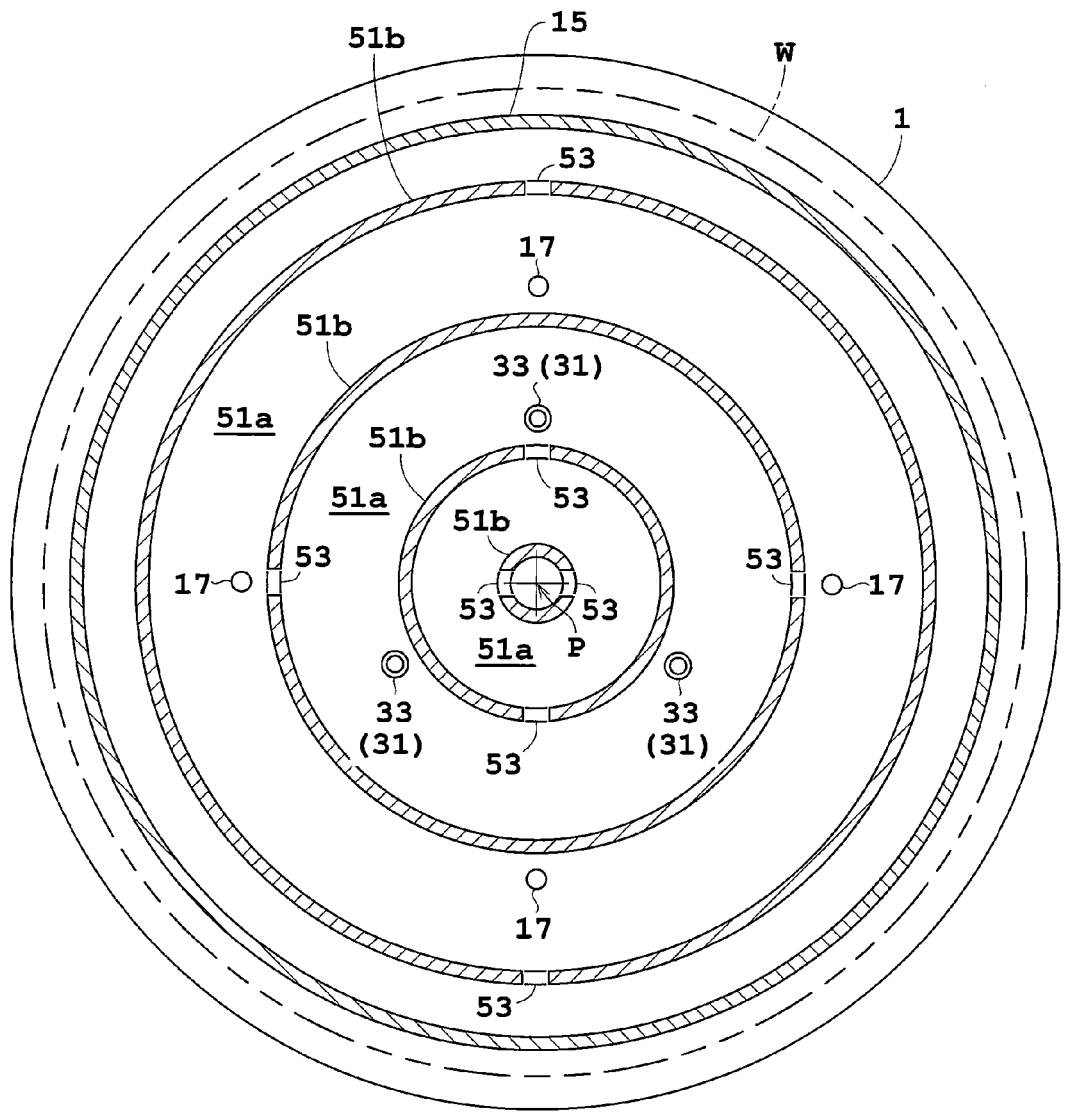
FIG. 9A is a plan view of a heat-treating plate in Embodiment 5.
Figure 9B:
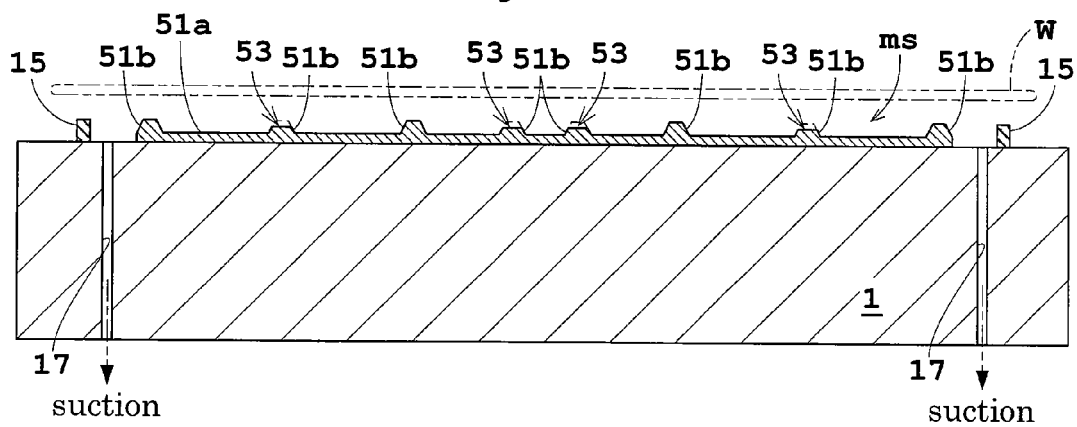
FIG. 9B is a view in vertical section of the heat-treating plate in Embodiment 5.

Embodiment 5 of this invention will be described hereinafter with reference to the drawings. Like reference numerals are used to identify like parts which are the same as in Embodiment 1 and will not particularly be described. FIG. 9A is a plan view of a heat-treating plate. FIG. 9B is a view in vertical section of the heat-treating plate.

Embodiment 5 includes a support member 51 and the sealer 15. The support member 51 is a sheet-like object having projections 51b formed thereon for contacting a wafer W. More particularly, the support member 51 includes a sheet-like base 51a covering the heat-treating plate 1 inwardly of the sealer 15 and having, formed thereon, a plurality of continuous projections 51b arranged in concentric circles. The projections 51b are ring-shaped and different in diameter, and arranged about the center point P on the upper surface of heat-treating plate 1. Each projection 51b has a sectional shape tapering from a lower portion to an upper portion that contacts the wafer W. Grooves 53 are formed in varied positions of each projection 51b for allowing communication between regions inside and outside each projection 51b. The support member 51 is formed of the same material as the support elements 11 described in Embodiment 1, for example. The support member 51 has openings formed in positions opposed to the exhaust bores 17 and perforations 33. The support member 51 corresponds to the support devices in this invention. The grooves 53 correspond to the groove portions in this invention.

Operation of the substrate heat treatment apparatus in Embodiment 5 in time of sucking the wafer W will be described.

The support member 51 supports the wafer W through line contact. At this time, the grooves 53 serve as vents between the regions inside and outside each projection 51b. That is, the minute space "ms" formed between the wafer W and heat-treating plate 1 is a single space communicating through the grooves 53, without being divided by the support member 51. The pressure in the minute space "ms" is adjusted to a negative pressure by exhausting gas from the minute space "ms" through the exhaust bores 17. The wafer W is drawn toward the heat-treating plate 1, and is leveled to follow the support member 51 and sealer 15.

Thus, according to the substrate heat treatment apparatus in Embodiment 5 also, the separation of the wafer W and heat-treating plate 1 can be maintained uniform.

Since heat is transferred to the gas in the minute space "ms" through the base 51a, slight variations in the temperature distribution over the heat-treating plate 1 (e.g. ±0.2 degrees) are absorbed to heat the gas in the minute space "ms" uniformly. Consequently, the heat conduction from the gas in the minute space "ms" to the wafer W is made uniform.

This invention is not limited to the foregoing embodiments, but may be modified as follows:

(1) Embodiment 1 described hereinbefore shows an arrangement of support elements 11 by way of example. This arrangement may be varied as appropriate.

(2) In Embodiments 1, 2, 3 and 5 described hereinbefore, each of the support elements 11 and 12 and projections 13b and 51b has a sectional shape considerably varying from the upper portion to the lower portion. This shape is not limitative, but their diameter may be the same from the upper portion to the lower portion.

(3) In Embodiment 2 described hereinbefore, grooves 18 are formed in each support element 12. The grooves 18 may be replaced with other appropriate means for allowing communication between the regions inside and outside each support element. Instead of forming the grooves 18 in each support element 12, grooves or through-holes may be formed in the heat-treating plate 1, for example.

(4) In Embodiment 4 described hereinbefore, the support elements 14 include the granular objects 14a, coating layer 14b and resin layer 14c. The resin layer 14c may be omitted, with the granular objects 14a arranged directly on the upper surface of heat-treating plate 1.

(5) In each embodiment described hereinbefore, the wafer W is circular. This is not limitative, but rectangular or otherwise shaped substrates may be treated. In this case, the shape of sealer 15 may be changed from circular to an appropriate shape according to the shape of substrates.

(6) In each embodiment described hereinbefore, heat pipes are embedded in the heat transfer portion 5. The invention is applicable also to a substrate heat treatment apparatus having no heat pipes.

This invention may be embodied in other specific forms without departing from the spirit or essential attributes thereof and, accordingly, reference should be made to the appended claims, rather than to the foregoing specification, as indicating the scope of the invention.

What is claimed is:

1. A substrate heat treatment apparatus for heat-treating a substrate, comprising:
    a heat-treating plate formed of metal and having a flat upper surface;
    support devices arranged on the upper surface of said heat-treating plate and formed entirely of a heat-resistant resin for contacting and supporting the substrate;
    wherein said support devices are projections formed on a sheet member for contacting the substrate;
    said sheet member being formed of heat-resistant resin and covering said flat upper surface of said heat-treating plate;
    a seal device disposed annularly on the upper surface of said heat-treating plate for contacting edges of the substrate to render gastight a space formed between the substrate and said heat-treating plate; and
    exhaust bores for exhausting gas from said space;
    said exhaust bores extending through said heat-treating plate from said upper surface to an opposite lower surface thereof;
    said heat-treating plate having a heating element mounted therein;
    said heat-treating plate having a metallic heat transfer portion disposed between said heating element and said upper surface of said heat-treating plate.

2. An apparatus as defined in claim 1, wherein said support devices is porous.

3. An apparatus as defined in claim 1, wherein said projections are arranged to make point contact with the substrate.

4. An apparatus as defined in claim 3, wherein said projections are arranged regularly.

5. An apparatus as defined in claim 1, wherein said projections are arranged in concentric circles.

6. An apparatus as defined in claim 5, wherein each of said projections has groove portions for allowing communication between regions inside and outside thereof.

7. An apparatus as defined in claim 1, wherein each of said projections has a sectional shape becoming smaller from a lower portion to an upper portion that contacts the substrate.

8. An apparatus as defined in claim 1, wherein said sheet member includes a ring-shaped ridge for contacting the edges of the substrate to render gastight the space formed between the substrate and said heat-treating plate, thereby acting as said seal device.

9. A substrate heat treatment apparatus for heat-treating a substrate, comprising:
    a heat-treating plate formed of metal and having a flat upper surface;
    support devices arranged on the upper surface of said heat-treating plate and formed entirely of a heat-resistant resin for contacting and supporting the substrate;
    a seal device disposed annularly on the upper surface of said heat-treating plate for contacting edges of the substrate to render gastight a space formed between the substrate and said heat-treating plate; and
    exhaust bores for exhausting gas from said space;
    said exhaust bores extending through said heat-treating plate from said upper surface to an opposite lower surface thereof;
    wherein said support devices include granular objects, and a coating layer covering said granular objects, said granular objects and said coating layer being formed of heat-resistant resin, and said coating layer bulging higher in positions where the granular objects are arranged than portions with no granular objects, to contact and support the substrate;
    said heat-treating plate having a heating element mounted therein;
    said heat-treating plate having a metallic heat transfer portion disposed between said heating element and said upper surface of said heat-treating plate.

10. An apparatus as defined in claim 9, further comprising a resin layer disposed between said support devices and said heat-treating plate.

11. An apparatus as defined in claim 9, wherein said support devices are chemical-resistant.

12. An apparatus as defined in claim 9, wherein said support devices are formed of one of polyimide, polytetrafluoroethylene (PTFE), polychlorotrifluoroethylene (PCTFE), polyetheretherketone (PEEK), polyphenylene sulphide (PPS),polyvinylidene fluoride (PVDF), polyethersulfone (PES), polysulfone (PSF), polyetherimide (PEI), and heat-resistant rubber materials.

13. An apparatus as defined in claim 9, wherein said seal device is heat-resistant and elastic.

14. An apparatus as defined in claim 9, wherein said seal device has a height exceeding a height of the support devices.

15. A substrate heat treatment apparatus for heat-treating a substrate, comprising:
    a heat-treating plate formed of metal and having a flat upper surface;
    support devices disposed above the upper surface of said heat-treating plate for contacting and supporting the substrate;
    wherein said support devices are projections formed on a sheet member for contacting the substrate;
    said sheet member being formed of a heat-resistant resin and covering said flat upper surface of said heat-treating plate, comprising a structure formed entirely of a heat-resistant resin, for providing thermal conduction from said heat-treating plate to said substrate that is limited by a thermal conductivity of said heat-resistant resin;
    a seal device disposed annularly on the upper surface of said heat-treating plate for contacting edges of the substrate to render gastight a space formed between the substrate and said heat-treating plate; and
    exhaust bores for exhausting gas from said space;
    said exhaust bores extending through said heat-treating plate from said upper surface to an opposite lower surface thereof;
    said heat-treating plate having a heating element mounted therein;
    said heat-treating plate having a metallic heat transfer portion disposed between said heating element and said upper surface of said heat-treating plate.

16. A substrate heat treatment apparatus for heat-treating a substrate, comprising:

a heat-treating plate formed of metal and having a flat upper surface;

support devices disposed above the upper surface of said heat-treating plate for contacting and supporting the substrate, comprising a structure formed entirely of a heat-resistant resin, for providing thermal conduction from said heat-treating plate to said substrate that is limited by a thermal conductivity of said heat-resistant resin;

wherein said support devices include granular objects, and a coating layer covering said granular objects, said granular objects and said coating layer being formed of a heat-resistant resin, and said coating layer bulging higher in positions where the granular objects are arranged than portions with no granular objects, to contact and support the substrate;

a seal device disposed annularly on the upper surface of said heat-treating plate for contacting edges of the substrate to render gastight a space formed between the substrate and said heat-treating plate; and exhaust bores for exhausting gas from said space;

said exhaust bores extending through said heat-treating plate from said upper surface to an opposite lower surface thereof;

said heat-treating plate having a heating element mounted therein;

said heat-treating plate having a metallic heat transfer portion disposed between said heating element and said upper surface of said heat-treating plate.

17. An apparatus as defined in claim 1, wherein said support devices are chemical-resistant.

18. An apparatus as defined in claim 1, wherein said support devices are formed of one of polyimide, polytetrafluoroethylene (PTFE), polychlorotrifluoroethylene (PCTFE), polyetheretherketone (PEEK), polyphenylene sulphide (PPS), polyvinylidene fluoride (PVDF), polyethersulfone (PES), polysulfone (PSF), polyetherimide (PEI), and heat-resistant rubber materials.

19. An apparatus as defined in claim 1, wherein said seal device is heat-resistant and elastic.

20. An apparatus as defined in claim 1, wherein said seal device has a height exceeding a height of the support devices.

21. A substrate heat treatment apparatus for heat-treating a substrate, comprising:

a heat-treating plate formed of metal and having a flat upper surface;

a support and seal member including a base covering said flat upper surface of said heat-treating plate, a plurality of projections on said base, and a ring-shaped ridge on said base;

wherein said support and seal member is formed of resin;

said plurality of projections contact the substrate;

said ring-shaped ridge contacts edges of the substrate to render gastight a space formed between the substrate and said heat-treating plate; and said ring-shaped ridge is formed integral with said base and said plurality of projections; and exhaust bores for exhausting gas from said space;

said exhaust bores extending through said heat-treating plate from said upper surface to an opposite lower surface thereof;

said heat-treating plate having a heating element mounted therein;

said heat-treating plate having a metallic heat transfer portion disposed between said heating element and said upper surface of said heat-treating plate.

22. An apparatus as defined in claim 1, wherein:

said heat transfer portion has a plurality of heat pipes embedded therein; and cooling grooves are formed between the plurality of heat pipes for circulating a cooling fluid.

23. An apparatus as defined in claim 9, wherein:

said heat transfer portion has a plurality of heat pipes embedded therein; and cooling grooves are formed between the plurality of heat pipes for circulating a cooling fluid.

24. An apparatus as defined in claim 15, wherein:

said heat transfer portion has a plurality of heat pipes embedded therein; and cooling grooves are formed between the plurality of heat pipes for circulating a cooling fluid.

25. An apparatus as defined in claim 16, wherein:

said heat transfer portion has a plurality of heat pipes embedded therein; and cooling grooves are formed between the plurality of heat pipes for circulating a cooling fluid.

26. An apparatus as defined in claim 21, wherein:

said heat transfer portion has a plurality of heat pipes embedded therein; and cooling grooves are formed between the plurality of heat pipes for circulating a cooling fluid.

* * * * *